US012638480B2

(12) United States Patent
Chou et al.

(10) Patent No.: US 12,638,480 B2
(45) Date of Patent: May 26, 2026

(54) POWER CABLE VOLTAGE DROP MONITORING

(71) Applicant: Quanta Computer Inc., Taoyuan City (TW)

(72) Inventors: Le-Sheng Chou, Taoyuan City (TW); Sz-Chin Shih, Taoyuan City (TW); Chia-Jen Lin, Taoyuan City (TW); Chun-Lin Yang, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 190 days.

(21) Appl. No.: 18/733,423

(22) Filed: Jun. 4, 2024

(65) Prior Publication Data

US 2025/0370013 A1 Dec. 4, 2025

(51) Int. Cl.
| | |
|---|---|
| *G08B 21/00* | (2006.01) |
| *G01R 19/165* | (2006.01) |
| *H02M 7/00* | (2006.01) |

(52) U.S. Cl.
CPC ...... *G01R 19/16538* (2013.01); *H02M 7/003* (2013.01)

(58) Field of Classification Search
CPC .......................... G01R 19/16538; H02M 7/003
USPC ....................................................... 340/693.1
See application file for complete search history.

(56) References Cited

U.S. PATENT DOCUMENTS

| | | | | |
|---|---|---|---|---|
| 10,684,634 B1 * | 6/2020 | Yang | ......................... | G06F 1/28 |
| 10,802,564 B2 | 10/2020 | Yang | | |
| 11,003,200 B1 * | 5/2021 | Roland | .............. | G01R 19/2503 |
| 2004/0027192 A1 * | 2/2004 | Fratti | ........................ | G05F 1/40 327/540 |
| 2020/0110454 A1 * | 4/2020 | Yang | ...................... | H02H 9/004 |

(Continued)

FOREIGN PATENT DOCUMENTS

| | | |
|---|---|---|
| TW | 202014822 A | 4/2020 |
| TW | 202227975 A | 7/2022 |

(Continued)

OTHER PUBLICATIONS

TW Office Action for Application No. 113129299 mailed Dec. 31, 2024, w/ First Office Action Summary, 4 pp.

(Continued)

*Primary Examiner* — Mark S Rushing
(74) *Attorney, Agent, or Firm* — NIXON PEABODY LLP

(57) ABSTRACT

A computing device includes one or more processing devices, a baseboard management controller (BMC), a power cable, a power distribution board (PDB), and one or more voltage sensors. The BMC is configured to monitor the one or more processing devices. The power cable is configured to receive electrical power from a busbar. The PDB is electrically connected to the BMC, the one or more processing devices, and the power cable. The PDB is configured to receive the electrical power from the power cable and distribute the electrical power to the BMC and the one or more or more processing devices. The voltage sensors are electrically connected to the power cable and/or the PDB, and are configured to generate voltage data indicative of a voltage drop across the power cable between (i) the busbar and (ii) a load that includes at least the PDB and the one or more processing devices.

16 Claims, 4 Drawing Sheets

(56)       References Cited

U.S. PATENT DOCUMENTS

2024/0356425 A1*   10/2024   Ostheim-Dzerowycz ...................
                                                     H05B 1/0288

FOREIGN PATENT DOCUMENTS

| TW | 202234239 A | 9/2022 |
|----|-------------|--------|
| TW | 202234242 A | 9/2022 |

OTHER PUBLICATIONS

TW Search Report for Application No. 113129299 mailed Dec. 31, 2024, w/ First Office Action, 1 p.

* cited by examiner

POWER CABLE VOLTAGE DROP MONITORING

FIELD OF THE INVENTION

The present disclosure relates generally to monitoring the voltage drop across a power cable connected to a busbar and a load, and more specifically, to monitoring the voltage drop across the power cable using integrated voltage sensors connected to voltage sense lines.

BACKGROUND OF THE INVENTION

Enclosure-based computing systems (e.g., rack-mounted or chassis-mounted computing systems) often utilize a busbar that distributes power to individual computing devices that are mounted in the enclosure. Ensuring proper physical contact between the busbar and corresponding connectors on the computing devices is important to ensure that the computing devices receive the desired voltage from the busbar, and to prevent damage resulting from voltage fluctuations due to improper contact. However, it can be difficult to determine the voltage that is present at the computing devices using existing techniques. Thus, new devices and methods for monitoring voltage in such computing systems are needed.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementations, the present disclosure is directed to a computing device that is configured to be mounted in an enclosure. The computing device includes one or more processing devices, a baseboard management controller (BMC), a power cable, a power distribution board (PDB), and one or more voltage sensors. The BMC is configured to monitor the one or more processing devices. The power cable is configured to receive electrical power from a busbar that is coupled to the enclosure. The PDB is electrically connected to the BMC, the one or more processing devices, and the power cable. The PDB is configured to receive the electrical power from the power cable and distribute the electrical power to the BMC and the one or more or more processing devices. The one or more voltage sensors are configured to generate voltage data indicative of a voltage drop across the power cable between (i) the busbar and (ii) a load that includes at least the PDB and the one or more processing devices.

In some aspects of the first implementation, the one or more voltage sensors are communicatively coupled to the BMC to transmit the voltage data to the BMC.

In some aspects of the first implementation, the one or more voltage sensors are communicatively coupled to the BMC via an $I^2C$ connection, and are each configured to generate the voltage data in $I^2C$ format.

In some aspects of the first implementation, the BMC is further configured to determine the voltage drop across the power cable based at least in part on the voltage data. The BMC is further configured to perform one or more actions in response to the voltage drop across the power cable exceeding one or more predetermined voltage drop thresholds.

In some aspects of the first implementation, the BMC is configured to shut down the computing device in response to the voltage drop across the power cable exceeding: (i) a high voltage drop threshold, and (ii) a low voltage drop threshold that is greater than the high voltage drop threshold. The BMC is configured to transmit an alert in response to the voltage drop across the power cable exceeding the low voltage drop threshold but not the high voltage drop threshold In some aspects of the first implementation, the high voltage drop threshold is about 100 millivolts (mV), and the low voltage drop threshold is about 55 mV.

In some aspects of the first implementation, the power cable includes a first connector configured to be coupled to the busbar, a second connector configured to be connected to the PDB, a positive voltage line connected to the first connector and the second connector, a negative voltage line connected to the first connector and the second connector, and a plurality of voltage sense lines extending between the first connector and the second connector.

In some aspects of the first implementation, the one or more voltage sensors includes a first voltage sensor and a second voltage sensor each integrated into the power cable. Each of the first voltage sensor and the second voltage sensor has a first voltage sense input and a second voltage sense input.

In some aspects of the first implementation, the plurality of voltage sense lines includes a first voltage sense line connected between (i) the positive voltage line at the first connector and (ii) the first voltage sense input of the first voltage sensor; a second voltage sense line connected between (i) the second voltage sense input of the first voltage sensor and (ii) the positive voltage line at the second connector; a third voltage sense line connected between (i) the negative voltage line at the first connector and (ii) the first voltage sense input of the second voltage sensor; and a fourth voltage sense line connected between (i) the second voltage sense input of the second voltage sensor and (ii) the negative voltage line at the second connector.

In some aspects of the first implementation, each of the first voltage sensor and the second voltage sensor is an analog-to-digital converter. The first voltage sensor converts an analog voltage drop across the positive voltage line between the first connector and the second connector into a first digital signal that is output as the voltage data by at least one data output of the first voltage sensor. The second voltage sensor converts an analog voltage drop across the negative voltage line between the first connector and the second connector into a second digital signal that is output as the voltage data by at least one data output of the second voltage sensor.

In some aspects of the first implementation, the at least one data output of both the first voltage sensor and the second voltage sensor is connected to at least one data pin of the second connector.

In some aspects of the first implementation, the at least one data pin of the second connector is connected to the BMC to allow the voltage data to be transmitted from the one or more voltage sensors to the BMC through the second connector. The BMC is configured to determine the voltage drop across the positive voltage line, the voltage drop across the negative voltage line, or both.

In some aspects of the first implementation, the one or more voltage sensors includes a first voltage sensor and a second voltage sensor mounted on the PDB. Each of the first voltage sensor and the second voltage sensor has a first voltage sense input and a second voltage sense input.

In some aspects of the first implementation, the plurality of voltage sense lines includes (i) a first voltage sense line connected to the positive voltage line at the first connector and (ii) a second voltage sense line connected to the negative voltage line at the first connector.

In some aspects of the present implementation, the first voltage sense input of the first voltage sensor is connected to the first voltage sense line at the first connector; the second voltage sense input of the first voltage sensor is connected to the positive voltage line at the second connector; the first voltage sense input of the second voltage sensor is connected to the second voltage sense line at the first connector; and the second voltage sense input of the second voltage sensor is connected to the negative voltage line at the second connector.

In some aspects of the first implementation, each of the first voltage sensor and the second voltage sensor is an analog-to-digital converter. The first voltage sensor converts an analog voltage drop across the positive voltage line between the first connector and the second connector into a first digital signal that is output as the voltage data by at least one data output of the first voltage sensor. The second voltage sensor converts an analog voltage drop across the negative voltage line between the first connector and the second connector into a second digital signal that is output as the voltage data by at least one data output of the second voltage sensor.

In some aspects of the first implementation, the at least one data output of both the first voltage sensor and the second voltage sensor is connected to the BMC to allow the voltage data to be transmitted from the one or more voltage sensors to the BMC through the second connector. The BMC is configured to determine the voltage drop across the positive voltage line, the voltage drop across the negative voltage line, or both.

In a second implementation, the present disclosure is directed to a computing system that includes an enclosure, a busbar, and a computing device. The busbar is coupled to the enclosure and is configured to be connected to mains power. The computing device includes a housing, one or more processing devices, a baseboard management controller (BMC), a power cable, a power distribution board (PDB), one or more processing devices, and one or more voltage sensors. The housing is mounted at least partially within the enclosure. The one or more processing devices are within the housing. The BMC is disposed within the housing and is configured to monitor the one or more processing devices. The power cable is disposed at least partially within the housing and is coupled to the busbar to receive electrical power from the busbar. The PDB is electrically connected to the BMC, the one or more processing devices, and the power cable. The PDB receives the electrical power from the power cable and distributes the electrical power to the BMC and the one or more or more processing devices. The one or more voltage sensors are configured to generate voltage data indicative of a voltage across a load that includes at least the PDB and the one or more processing devices.

In a third implementation, the present disclosure is directed to a method of monitoring a computing device that includes one or more processing devices, a baseboard management controller (BMC), a power cable receiving electrical power that is distributed to the BMC and the one or more processing devices, and one or more voltage sensors. The method includes receiving, from one or more voltage sensors electrically connected to the power cable, voltage data indicative of a voltage across a load that includes at least the one or more processing devices. The method further includes analyzing the voltage data using the BMC to determine the voltage drop across the power cable. The method further includes shutting down the computing device using the BMC in response to the voltage drop across the power cable exceeding: (i) a high voltage drop threshold, and (ii) a low voltage drop threshold that is less than the high voltage drop threshold. The method further includes transmitting an alert using the BMC in response to the voltage drop across the power cable exceeding the low voltage drop threshold but not the high voltage drop threshold.

In some aspects of the third implementation, the high voltage drop threshold is about 100 millivolts (mV), and the low voltage drop threshold is about 55 mV.

In some aspects of the third implementation, the values of the high voltage drop threshold and the low voltage drop threshold are stored in firmware of the BMC. The method further includes, prior to analyzing the voltage data, updating the value of the high voltage drop threshold, the value of the low voltage drop threshold, or both.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
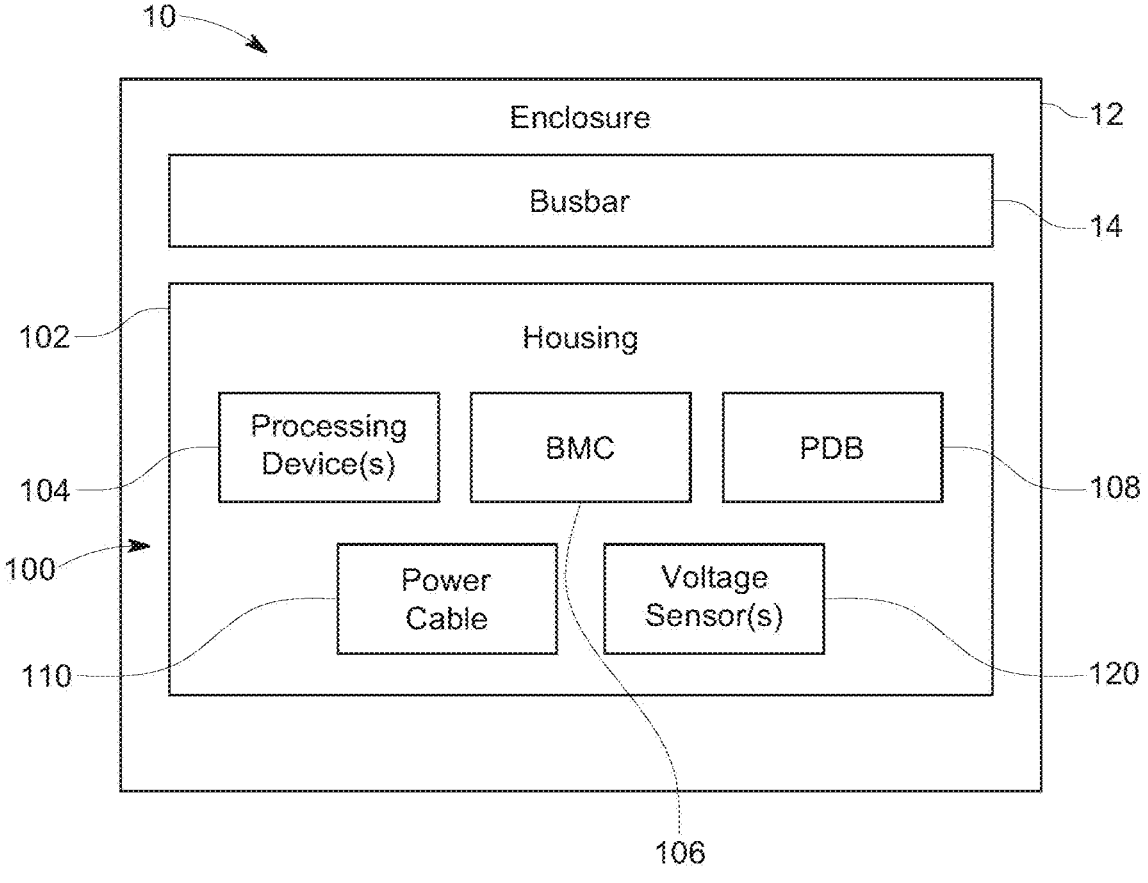
FIG. 1 is a block diagram of a computing system, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 is a block diagram of a computing system 10, according to aspects of the present disclosure. In the illustrated implementation, the computing system 10 includes an enclosure 12, a busbar 14 coupled to the enclosure 12, and a computing device 100. The computing device 100 is mounted at least partially within the enclosure. In some implementations, the enclosure 12 is a server rack that is able to receive individual rack servers therein. The rack may include additional features such as movable rails, a tilt mechanism, cable management features, etc. In some implementations, the enclosure 12 is a server bay that is able to receive individual blade servers and/or clusters of blade servers therein. In general, the enclosure 12 can be any suitable structure that is able to receive the computing device 100 at least partially therein, and may be able to receive additional computing devices as well. In some implementations, the enclosure 12 conforms to the Open Rack V3 specification published by the Open Compute Project®. Thus, the computing device 100 may be a rack server or a blade server cluster (e.g., with a plurality of blade servers).

The busbar 14 can be electrically connected to mains power to provide electrical power for computing device 100 (and any other computing devices that may be mounted in the enclosure 12. In some implementations, the busbar 14 extends vertically along the back of the enclosure 12. When the computing device 100 is mounted in the enclosure 12, a connector on the back of the computing device 100 electrically connects to the busbar 14, so that electrical power from the busbar 14 flows to the computing device 100.

In some implementations, the busbar 14 is connected directly to mains power. In these implementations, the busbar 14 may include an integrated wall plug and any needed electronics. In other implementations, the enclosure 12 may include a separate device mounted therein (sometimes referred to as a "power shelf") that is directly connected to mains power. The power shelf converts mains AC power to DC power which is sent to the busbar 14. The busbar 14 then distributes the DC power to the computing device 100 and any other computing devices mounted within the enclosure 12. Thus, in these implementations, the busbar 14 is coupled to mains power through the power shelf but is not coupled directly to mains power.

The computing device 100 includes a housing 102 within which (or partially within which) a variety of different components are disposed. In the illustrated implementation, the computing device 100 includes one or more processing devices 104, a baseboard management controller (BMC) 106, a power distribution board (PDB) 108, a power cable 110, and one or more voltage sensors 120, all mounted partially or wholly within the housing 102. The housing 102 can be slid into the enclosure 12 to thereby mount the computing device 100 in the enclosure 12. In implementations where the computing device 100 is a blade server cluster, the one or more processing devices may include one or more blade servers.

The BMC 106 is a controller that manages the operation of the one or more processing devices 104. In some cases, the BMC 106 also manages the operation of the computing device 100 as a whole. The BMC 106 is connected to the one or more processing devices 104 to allow the BMC to monitor and manage various aspects of the processing devices 104, such as power use and temperature. In general, the BMC 106 can be configured to monitor and/or manage any components of the computing device 100, including memory devices such as HDDs, SDDs, flash memory, etc.; expansion cards such as PCIe cards or OCP cards; power supplies; fan modules; and the like. The BMC 106 may also include a network connection (such as via a network interface controller, or NIC) to a management network, which allows for remote access to and management of the computing device 100.

The PDB 108 is electrically connected to the busbar 14 via the power cable 110. The PDB 108 receives electrical power from the power cable 110, and distributes the electrical power to the one or more processing devices 104 and the BMC 106. In some implementations, the PDB 108 include power monitoring and/or management functionality. For example, the PDB 108 can be configured to monitor voltages and other characteristics at any device that is receiving power from the PDB 108 (e.g., the one or more processing devices 104, the BMC 106, etc.). The PDB 108 may also include switching functionality that is able to disconnect specific devices (e.g., specific ones of the one or more processing devices 104) if the PDB 108 detects an issues. In some implementations, the PDB 108 also acts as a hot-swap controller, allowing for replacement of individual ones of the one or more processing devices 104 without powering down the entire computing device 100.

The one or more voltage sensors 120 are used to monitor the voltage drop across the power cable 110 (e.g., the difference between the voltage at a first of end of the power cable 110 connected to the busbar 14, and a second end of the power cable 110 connected to the PDB 108). The voltage sensors 120 are configured to generate voltage data that is indicative of the voltage drop across a load connected to the second end of the power cable 110. This load can include any combination of the one or more processing devices 104, the BMC 106, and the PDB 108. The voltage sensors 120 can then transmit the voltage data to the BMC 106. The voltage sensors 120 are communicatively coupled to the BMC 106 to allow for the transmission of the voltage data. In some cases, the voltage sensors 120 are communicatively coupled to the BMC via an I²C connection. The BMC 106 can analyze the voltage data to determine the voltage drop across the power cable 110, which in some cases is indicative of whether proper contact has been made between the busbar 14 and the power cable 110. The BMC 106 can take any necessary actions based on the amount of voltage drop (e.g., if the voltage drop excess one or more predetermined thresholds).

As discussed in more detail herein, in some implementations each of the voltage sensors 120 is an analog-to-digital converter that converts an analog voltage drop (e.g., the voltage drop across the power cable 110) into a digital signal that is output as the voltage data. In some implementations, the voltage sensors 120 output the voltage data in I²C format. In these implementations, the voltage sensors 120 (which may be analog-to-digital converters) include two separate outputs for the serial data line (SDA) and serial clock line (SCL) required for I²C communication.

Figure 2:
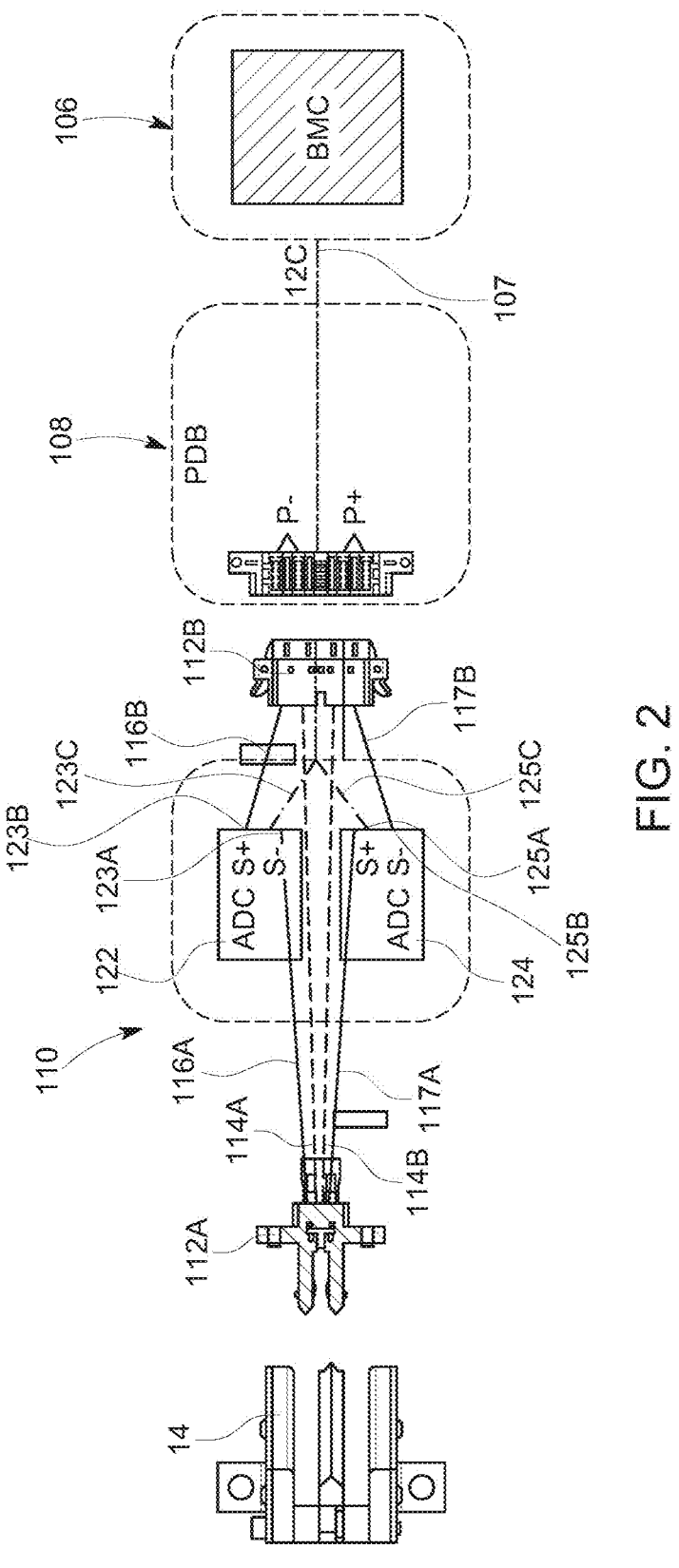
FIG. 2 is a first implementation of a power cable and one or more voltage sensors of the computing system of FIG. 1, according to aspects of the present disclosure.

FIG. 2 illustrates a first implementation of the power cable 110, where two voltage sensors 122 and 124 are integrated into the power cable 110 itself. As shown, the power cable 110 includes a first connector 112A that can be electrically connected to the busbar 14, and a second connector 112B configured to be electrically connected to the PDB 108. The power cable 110 includes a negative voltage line 114A and a positive voltage line 114B (either of which may be considered a ground line) connecting the first connector 112A and the second connector 112B. These voltage lines 114A and 114B terminate at the second connector, such that the electrical power is delivered to the PDB 108 when the second connector 112B is electrically connected to the PDB 108. The negative voltage line 114A is connected to positive voltage pins of the first connector 112A and the second connector 112B. The positive voltage line 114B is connected to negative voltage pins of the first connector 112A and the second connector 112B.

The power cable 110 includes a plurality of voltage sense lines. In the illustrated implementation, the plurality of voltage sense lines includes four voltage sense lines 116A, 116B, 117A, and 117B. The voltage sense line 116A extends between the positive voltage pin on the first connector 112A (e.g., where the negative voltage line 114A originates) and the voltage sensor 122. The voltage sense line 117A extends between the negative voltage pin on the first connector 112A (e.g., where the positive voltage line 114B originates) and the voltage sensor 124. The voltage sense line 116B extends between the voltage sensor 122 and the positive voltage pin on the second connector 112B (e.g., where the negative voltage line 114A terminates). The voltage sense line 117B extends between the voltage sensor 124 and the negative voltage pin on the second connector 112B (e.g., where the positive voltage line 114B terminates).

The voltage sensor 122 includes two voltage sense inputs 123A and 123B. The voltage sense line 116A is connected to the voltage sense input 123A, and the voltage sense line 116B is connected to the voltage sense input 123B. The voltage sense lines 116A and 116B are designed to carry little to no current (which may be as a result of, for example, a high impedance at the voltage sense inputs 123A and 123B), and are connected to the negative voltage line 114A generally as close as possible to the first connector 112A and the second connector 112B, respectively. Thus, the voltage that is present at the voltage sense input 123A (through the voltage sense line 116A) is generally equal to the voltage on the negative voltage line 114A at the first connector 112A, and the voltage that is present at the voltage sense input 123B (through the voltage sense line 116B) is generally equal to the voltage on the negative voltage line 114A at the second connector 112B. The voltage sensor 122 includes a data output 123C that is configured to output voltage data indicative of the voltage difference between the two voltage sense inputs 123A and 123B, which is generally equal to the voltage drop along the negative voltage line 114A.

The voltage sensor 124 includes two voltage sense inputs 125A and 125B. The voltage sense line 117A is connected to the voltage sense input 125A, and the voltage sense line 117B is connected to the voltage sense input 125B. The voltage sense lines 117A and 117B are designed to carry little to no current (which may be as a result of, for example, a high impedance at the voltage sense inputs 125A and 125B), and are connected to the positive voltage line 114B generally as close as possible to the first connector 112A and the second connector 112B, respectively. Thus, the voltage that is present at the voltage sense input 125A (through the voltage sense line 117A) is generally equal to the voltage on the positive voltage line 114B at the first connector 112A, and the voltage that is present at the voltage sense input 125B (through the voltage sense line 117B) is generally equal to the voltage on the positive voltage line 114B at the second connector 112B. The voltage sensor 124 includes a data output 125C that is configured to output voltage data indicative of the voltage difference between the two voltage sense inputs 125A and 125B, which is generally equal to the voltage drop along the positive voltage line 114B.

In the illustrated implementation, each of the voltage sensors 122 and 124 is an analog-to-digital converter that converts the analog voltage difference at its two respective voltage sense inputs (e.g., the analog voltage drops across the negative voltage line 114A and the positive voltage line 114B) into a digital signal, which is output as the voltage sensor at the data output 123C, 125C of the respective one of the voltage sensors 122 and 124. The voltage sensors 122 and 124 output the voltage data in I²C format, and thus each of the data outputs 123C and 125C will include a serial data line (SDA) output and a serial clock line (SCL) output.

The data outputs 123C and 125C of the voltage sensors 122 and 124 are connected to one or more data pins on the second connector 112B via an I²C connection 121. In the illustrated implementation, the I²C connection 121 includes an SDA line connected at one end to the SDA outputs of both voltage sensors 122 and 124, and at the other end to an SDA pin on the second connector 112B. The I²C connection 121 also includes an SCL line connected at one end to the SCL outputs of both voltage sensors 122 and 124, and at the other end to an SCL pin on the second connector 112B.

The data pins on the second connector 112B are connected to the BMC 106 via an I²C connection 107 (or any other suitable connection), which may be formed by traces on the PDB 108 and/or any other suitable connection between the PDB 108 and the BMC 106. The BMC 106 is thus able to receive the voltage data from the voltage sensors 122 and 124. The BMC 106 analyzes the voltage data from the voltage sensor 122 to determine the voltage drop across the negative voltage line 114A, and analyzes the voltage data from the voltage sensor 124 to determine the voltage drop across the positive voltage line 114B. In some implementations, there is also a separate alert pin in the cable that is connected to the BMC 106 (for example, through the PDB 108). This alert pin can be connected to, for example, the voltage sensors 122 and 124, and can be designed to trigger an alert signal (e.g., a logically high voltage) when the voltage drop across the negative voltage line 114A and/or the positive voltage line 114B exceeds a predefined voltage drop threshold. Thus, the alert pin can provide the BMC 106 an alternative indication as to when the voltage drop threshold is exceeded.

Figure 3:
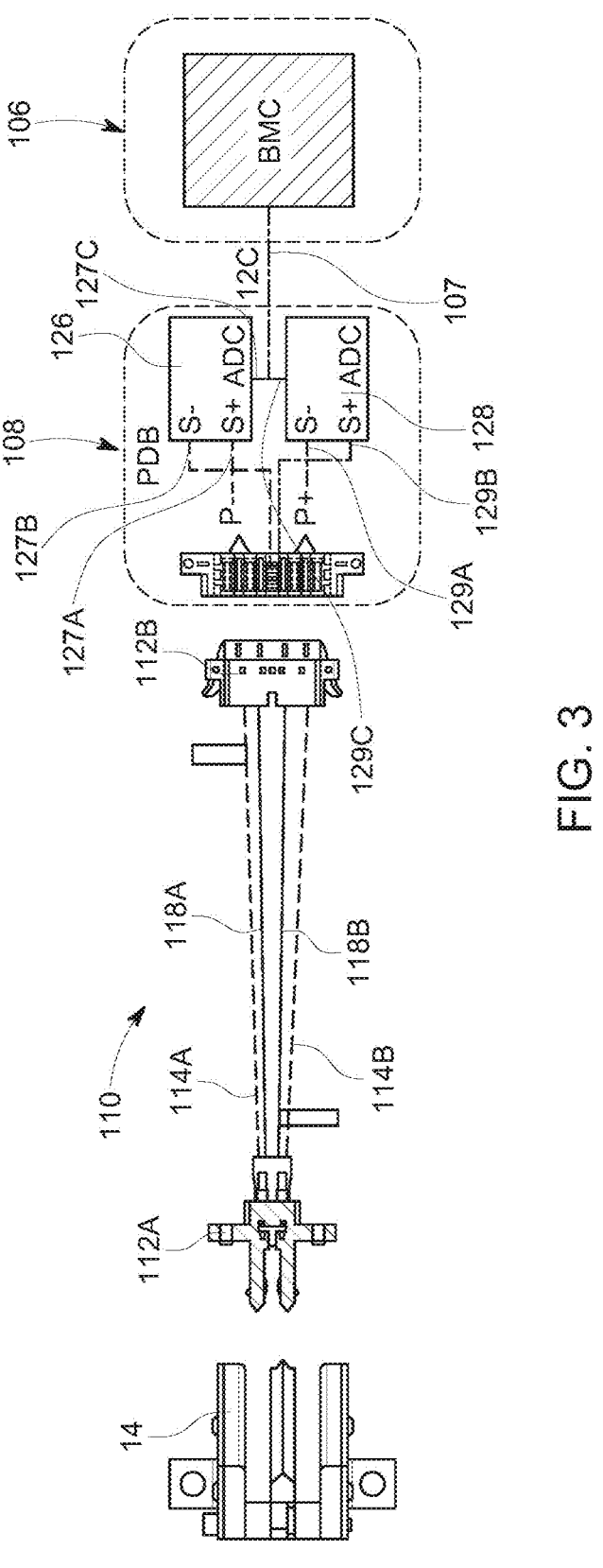
FIG. 3 is a second implementation of a power cable and one or more voltage sensors of the computing system of FIG. 1, according to aspects of the present disclosure.

FIG. 3 illustrates a second implementation of the power cable 110 where two voltage sensors 126 and 128 are mounted on the PDB 108, instead of being integrated into the power cable 110. As shown, the first connector 112A is connected to the busbar 14 and the second connector 112B is connected to the PDB 108, similar to FIG. 2. Also similar to FIG. 2, the negative voltage line 114A is connected to negative voltage pins of the first connector 112A and the second connector 112B, and the positive voltage line 114B is connected to positive voltage pins of the first connector 112A and the second connector 112B.

The power cable 110 includes a plurality of voltage sense lines. In the illustrated implementation, the plurality of voltage sense lines includes only two voltage sense lines 118A and 118B. The voltage sense line 118A extends between the negative voltage (or ground) pin on the first connector 112A (e.g., where the negative voltage line 114A originates) and a negative voltage pin on the second connector 112B. The voltage sense line 118B extends between the positive voltage pin on the first connector 112A (e.g., where the positive voltage line 114B originates) and a positive voltage pin on the second connector 112B. The power cable 110 also includes the negative voltage line 114A and the positive voltage line 114B, each extending between the first connector 112A and the second connector 112B.

The voltage sensor 126 includes two voltage sense inputs 127A and 127B. The voltage sense input 127A is connected to the negative voltage line 114A through (i) the negative voltage (or ground) pin of the second connector 112B and (ii) a connector 109 on the PDB. The voltage that is present at the voltage sense input 127A is thus generally equal to the voltage on the negative voltage line 114A at the second connector 112B.

The voltage sense input 127B is connected to the voltage sense line 118A through the negative voltage pin of the second connector 112B. The voltage sense line 118A is designed to carry little to no current (which may be as a result of, for example, a high impedance at the voltage sense input 127B), and is connected to the negative voltage line 114A generally as close as possible to the first connector 112A, and is not connected to the negative voltage line 114A at the second connector 112B.

Thus, the voltage that is present at the voltage sense input 127B (through the voltage sense line 118A) is generally equal to the voltage on the negative voltage line 114A at the first connector 112A. The voltage sensor 126 includes a data output 127C that is configured to output voltage data indicative of the voltage difference between the two voltage sense inputs 127A and 127B, which is generally equal to the voltage drop along the negative voltage line 114A.

The voltage sensor 128 includes two voltage sense inputs 129A and 129B. The voltage sense input 129A is connected to the positive voltage line 114B through (i) the positive voltage pin of the second connector 112B and (ii) the connector 109 on the PDB. The voltage that is present at the voltage sense input 129A is thus generally equal to the voltage on the positive voltage line 114B at the second connector 112B.

The voltage sense input 129B is connected to the voltage sense line 118B through the positive voltage pin of the second connector 112B. The voltage sense line 118B is designed to carry little to no current (which may be as a result of, for example, a high impedance at the voltage sense input 129B), and is connected to the positive voltage line 114B generally as close as possible to the first connector 112A, and is not connected to the positive voltage line 114B at the second connector 112B.

Thus, the voltage that is present at the voltage sense input 129B (through the voltage sense line 118B) is generally equal to the voltage on the positive voltage line 114B at the first connector 112A. The voltage sensor 128 includes a data output 129C that is configured to output voltage data indicative of the voltage difference between the two voltage sense inputs 129A and 129B, which is generally equal to the voltage drop along the positive voltage line 114B.

In the illustrated implementation, each of the voltage sensors 126 and 128 is an analog-to-digital converter that converts the analog voltage difference at its two respective voltage sense inputs (e.g., the analog voltage drops across the negative voltage line 114A and the positive voltage line 114B) into a digital signal, which is output as the voltage sensor at the data output 127C, 129C of the respective one of the voltage sensors 126 and 128. The voltage sensors 126 and 128 output the voltage data in I²C format, and thus each of the data outputs 127C and 129C will include a serial data line (SDA) output and a serial clock line (SCL) output.

The data outputs 127C and 129C of the voltage sensors 126 and 128 are connected to the BMC 106 via an I²C connection 107 (or any other suitable connection), which may be formed by traces on the PDB 108 and/or any other suitable connection between the PDB 108 and the BMC 106. The BMC 106 is thus able to receive the voltage data from the voltage sensors 126 and 128. The BMC 106 analyzes the voltage data from the voltage sensor 126 to determine the voltage drop across the negative voltage line 114A, and analyzes the voltage data from the voltage sensor 128 to determine the voltage drop across the positive voltage line 114B.

Thus, in both of the implementations illustrated in FIG. 2 and FIG. 3, two different voltage sensors are used to determine the voltage drop across the negative voltage line 114A of the power cable 110 and the positive voltage line 114B of the power cable 110. One of the voltage sensors includes voltage sense inputs that are connected to the ends of the negative voltage line 114A at the first connector 112A and the second connector 112B. The other voltage sensor includes voltage sense inputs that are connected to the ends of the positive voltage line 114B at the first connector 112A and the second connector 112B. The voltage data that is generated by the voltage sensors can be analyzed by the BMC 106 to determine the voltage drop across the power cable 110. In some implementations, the BMC 106 takes action based on only the voltage drop across the negative voltage line 114A. In other implementations, the BMC 106 takes action based on only the voltage drop across the positive voltage line 114B. In further implementations, the BMC 106 takes action based on the voltage drop across the negative voltage line 114A and/or the positive voltage line 114B.

While FIGS. 2 and 3 refer to the voltage lines 114A and 114B as being negative and positive lines, and refer to various different pins as being positive pins and negative pins, it is understood that the positive and negative voltage lines can generally be connected in any manner necessary for the proper functioning of the computing device 100. The different voltage sensors can be connected to the voltage lines and the voltage sense lines as necessary regardless of any positive and negative arrangements, so long as the voltage along the two voltage lines and the two voltage sense lines can be measured, and the voltage drop across the cable determined.

Figure 4:
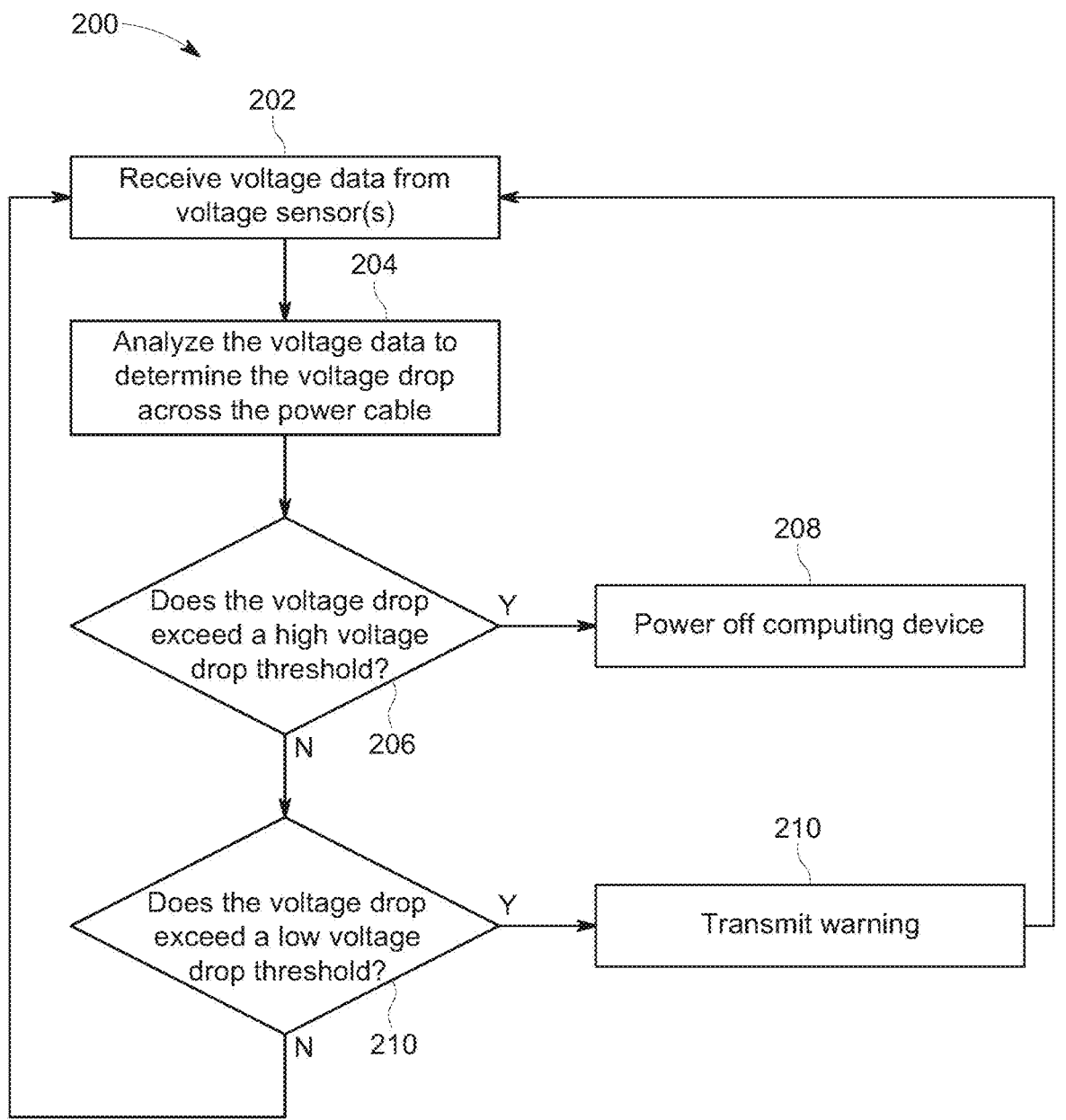
FIG. 4 is a flowchart of a method of monitoring a computing device of the computing system of FIG. 1, according to aspects of the present disclosure.

FIG. 4 is a flowchart of method 200 for managing the computing device 100 (in FIG. 1). Step 202 includes receiving voltage data from the one or more voltage sensors 120 (in FIG. 1). In some implementations, the one or more voltage sensors 120 include the voltage sensors 122 and 124 (in FIG. 2) that are integrated into the power cable 110 (in FIG. 1). In other implementations, the one or more voltage sensors 120 include the voltage sensors 126 and 128 (in FIG. 3) that are mounted on the PDB 108 (in FIG. 1). In any implementation, the voltage data is received at the BMC 106 (in FIG. 1).

Step 204 includes analyzing the voltage data using the BMC 106 to determine the voltage drop across the power cable 110, which as discussed herein may include the voltage drop across the negative voltage line 114A (FIGS. 2 and 3), the voltage drop across the positive voltage line 114B (FIGS. 2 and 3), or both. Step 206 includes determining whether the voltage drop across the power cable 110 exceeds a high voltage drop threshold. If it does, method 200 proceeds to step 208, where the computing device 100 is powered off. If the voltage drop does not exceed the high voltage drop threshold, method 200 proceeds to step 210, which includes determining whether the voltage drop across the power cable 110 exceeds a low voltage drop threshold. If it does, method 200 proceeds to step 210, where the BMC 106 transmits a warning (e.g., a message to an administrator or a technician). Method 200 then returns to step 202. If the voltage drop does not exceed the low voltage drop threshold, method 200 returns to step 202. After returning to step 202, method 200 can be performed again.

In some implementations, method 200 can be performed repeatedly during use of the computing device 100, to constantly monitor the voltage drop across the power cable 110. In these implementations, while the computing device 100 is powered on, method 200 could be repeated after a predetermined amount of time, such as every 30 seconds, every minute, every 5 minutes, every 10 minutes, every 30 minutes, every hour, etc.

In some implementations, method 200 can also be performed when the computing device 100 is initially powered on to determine whether proper contact has been made between the busbar 14 and the power cable 110. In these implementations, the BMC 106 may be powered via an auxiliary power source, prior to the PDB 108 receiving power from the busbar 14. When the power cable 110 is connected to the busbar 14, the BMC 106 can receive the voltage data and determine the voltage drop across the power cable 110. If the voltage drop exceeds the high voltage drop threshold, the BMC 106 can prevent the PDB 108 from distributing power to the processing devices 104, and/or prevent any of the processing devices 104 from receiving power from the PDB 108. The BMC 106 thus effectively prevents the computing device 100 from powering on. If the voltage drop exceeds the low voltage drop threshold, the BMC 106 can transmit the warning, and then allow the power to be distributed to the processing devices 104. If the voltage drop does not exceed either voltage drop threshold, the BMC 106 can allow the power to be distributed to the processing devices 104 and allow the computing device 100 to function normally.

Any suitable values can be used for the voltage drop thresholds. For example, in some implementations, the high voltage drop threshold is about 100 mV, and the low voltage drop threshold is about 55 mV. In general, the high voltage drop threshold can be between about 50 mV and about 200 mV, between about 75 mV and about 150 mV, between about 90 mV and about 110 mV, or about 100 mV. The low voltage drop threshold can be between about 1 mV and about 100 mV, between about 25 mV and about 75 mV, between about 40 mV and about 60 mV, or about 55 mV.

In some implementations, the values of the voltage drop thresholds are stored in a memory of the computing device 100. For example, in some cases, the values are stored in the firmware of the BMC 106. In these cases, method 200 can further include updating the value of the high voltage drop threshold and/or the low voltage drop threshold. This step could be performed prior to receiving the voltage data or prior to analyzing the voltage data. This step could also be performed if the circumstances around the computing device 100 change. For example, if the computing device 100 is altered to have a different number of processing devices 104, then the voltage drop thresholds may need to be updated method 200 is performed. In another example, if the voltage drop thresholds could be updated if the amount of power provided by the busbar 14.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A computing device configured to be mounted in an enclosure, the computing device comprising:

one or more processing devices;

a baseboard management controller (BMC) configured to monitor the one or more processing devices;

a power cable configured to receive electrical power from a busbar that is coupled to the enclosure;

a power distribution board (PDB) electrically connected to the BMC, the one or more processing devices, and the power cable, the PDB being configured to receive the electrical power from the power cable and distribute the electrical power to the BMC and the one or more or more processing devices; and one or more voltage sensors electrically configured to generate voltage data indicative of a voltage drop across the power cable between (i) the busbar and (ii) a load that includes at least the PDB and the one or more processing devices;

wherein the power cable includes a first connector configured to be coupled to the busbar, a second connector configured to be connected to the PDB, a positive voltage line connected to the first connector and the second connector, a negative voltage line connected to the first connector and the second connector, and a plurality of voltage sense lines extending between the first connector and the second connector, wherein the one or more voltage sensors includes a first voltage sensor and a second voltage sensor each integrated into the power cable, each of the first voltage sensor and the second voltage sensor having a first voltage sense input and a second voltage sense input; and wherein the plurality of voltage sense lines includes:

a first voltage sense line connected between (i) the positive voltage line at the first connector and (ii) the first voltage sense input of the first voltage sensor;

a second voltage sense line connected between (i) the second voltage sense input of the first voltage sensor and (ii) the positive voltage line at the second connector;

a third voltage sense line connected between (i) the negative voltage line at the first connector and (ii) the first voltage sense input of the second voltage sensor; and a fourth voltage sense line connected between (i) the second voltage sense input of the second voltage sensor and (ii) the negative voltage line at the second connector.

2. The computing device of claim 1, wherein the one or more voltage sensors are communicatively coupled to the BMC to transmit the voltage data to the BMC.

3. The computing device of claim 1, wherein the one or more voltage sensors are communicatively coupled to the BMC via an $I^2C$ connection, and are each configured to generate the voltage data in $I^2C$ format.

4. The computing device of claim 2, wherein the BMC is further configured to:

determine the voltage drop across the power cable based at least in part on the voltage data; and perform one or more actions in response to the voltage drop across the power cable exceeding one or more predetermined voltage drop thresholds.

5. The computing device of claim 1, wherein the BMC is further configured to:

shut down the computing device in response to the voltage drop across the power cable exceeding both (i) a high voltage drop threshold and (ii) a low voltage drop threshold that is greater than the high voltage drop threshold; and transmit an alert in response to the voltage drop across the power cable exceeding the low voltage drop threshold but not the high voltage drop threshold.

6. The computing device of claim 5, wherein the high voltage drop threshold is about 100 millivolts (mV) and the low voltage drop threshold is about 55 mV.

7. The computing device of claim 1, wherein each of the first voltage sensor and the second voltage sensor is an analog-to-digital converter, the first voltage sensor converting an analog voltage drop across the positive voltage line between the first connector and the second connector into a first digital signal that is output as the voltage data by at least one data output of the first voltage sensor, the second voltage sensor converting an analog voltage drop across the negative voltage line between the first connector and the second connector into a second digital signal that is output as the voltage data by at least one data output of the second voltage sensor.

8. The computing device of claim 7, wherein the at least one data output of both the first voltage sensor and the second voltage sensor is connected to at least one data pin of the second connector.

9. The computing device of claim 8, wherein the at least one data pin of the second connector is connected to the BMC to allow the voltage data to be transmitted from the one or more voltage sensors to the BMC through the second connector, the BMC being configured to determine the voltage drop across the positive voltage line, the voltage drop across the negative voltage line, or both.

10. A computing device configured to be mounted in an enclosure, the computing device comprising:

one or more processing devices;

a baseboard management controller (BMC) configured to monitor the one or more processing devices;

a power cable configured to receive electrical power from a busbar that is coupled to the enclosure;

a power distribution board (PDB) electrically connected to the BMC, the one or more processing devices, and the power cable, the PDB being configured to receive the electrical power from the power cable and distribute the electrical power to the BMC and the one or more or more processing devices; and one or more voltage sensors electrically configured to generate voltage data indicative of a voltage drop across the power cable between (i) the busbar and (ii) a load that includes at least the PDB and the one or more processing devices;

wherein the power cable includes a first connector configured to be coupled to the busbar, a second connector configured to be connected to the PDB, a positive voltage line connected to the first connector and the second connector, a negative voltage line connected to the first connector and the second connector, and a plurality of voltage sense lines extending between the first connector and the second connector;

wherein the one or more voltage sensors includes a first voltage sensor and a second voltage sensor mounted on the PDB, each of the first voltage sensor and the second voltage sensor having a first voltage sense input and a second voltage sense input, wherein the plurality of voltage sense lines includes (i) a first voltage sense line connected to the positive voltage line at the first connector and (ii) a second voltage sense line connected to the negative voltage line at the first connector, and wherein:

the first voltage sense input of the first voltage sensor is connected to the first voltage sense line at the first connector;

the second voltage sense input of the first voltage sensor is connected to the positive voltage line at the second connector;

the first voltage sense input of the second voltage sensor is connected to the second voltage sense line at the first connector; and the second voltage sense input of the second voltage sensor is connected to the negative voltage line at the second connector.

11. The computing device of claim 10, wherein each of the first voltage sensor and the second voltage sensor is an analog-to-digital converter, the first voltage sensor converting an analog voltage drop across the positive voltage line between the first connector and the second connector into a first digital signal that is output as the voltage data by at least one data output of the first voltage sensor, the second voltage sensor converting an analog voltage drop across the negative voltage line between the first connector and the second connector into a second digital signal that is output as the voltage data by at least one data output of the second voltage sensor.

12. The computing device of claim 11, wherein the at least one data output of both the first voltage sensor and the second voltage sensor is connected to the BMC to allow the voltage data to be transmitted from the one or more voltage sensors to the BMC through the second connector, the BMC being configured to determine the voltage drop across the positive voltage line, the voltage drop across the negative voltage line, or both.

13. A computing system comprising:
an enclosure;
a busbar coupled to the enclosure and configured to be connected to mains power; and
a computing device including:
a housing mounted at least partially within the enclosure;
one or more processing devices disposed within the housing;
a baseboard management controller (BMC) disposed within the housing and configured to monitor the one or more processing devices;
a power cable disposed at least partially within the housing, the power cable being coupled to the busbar to receive electrical power from the busbar;
a power distribution board (PDB) electrically connected to the BMC, the one or more processing devices, and the power cable, the PDB being configured to receive the electrical power from the power cable and distribute the electrical power to the BMC and the one or more or more processing devices;
one or more voltage sensors electrically configured to generate voltage data indicative of a voltage drop across the power cable between (i) the busbar and (ii) a load that includes at least the PDB and the one or more processing devices;
wherein the power cable includes a first connector configured to be coupled to the busbar, a second connector configured to be connected to the PDB, a positive voltage line connected to the first connector and the second connector, a negative voltage line connected to the first connector and the second connector, and a plurality of voltage sense lines extending between the first connector and the second connector,
wherein the one or more voltage sensors includes a first voltage sensor and a second voltage sensor each integrated into the power cable, each of the first voltage sensor and the second voltage sensor having a first voltage sense input and a second voltage sense input; and
wherein the plurality of voltage sense lines includes:
a first voltage sense line connected between (i) the positive voltage line at the first connector and (ii) the first voltage sense input of the first voltage sensor;
a second voltage sense line connected between (i) the second voltage sense input of the first voltage sensor and (ii) the positive voltage line at the second connector;

a third voltage sense line connected between (i) the negative voltage line at the first connector and (ii) the first voltage sense input of the second voltage sensor; and
a fourth voltage sense line connected between (i) the second voltage sense input of the second voltage sensor and (ii) the negative voltage line at the second connector.

14. A method of monitoring a computing device that includes one or more processing devices, a baseboard management controller (BMC), a power cable receiving electrical power that is distributed to the BMC and the one or more processing devices, and one or more voltage sensors electrically connected to the power cable, where the power cable is configured to receive electrical power from a busbar that is coupled to the computing device, wherein the power cable includes a first connector configured to be coupled to the busbar, a second connector configured to be connected to a power distribution board (PDB), a positive voltage line connected to the first connector and the second connector, a negative voltage line connected to the first connector and the second connector, and a plurality of voltage sense lines extending between the first connector and the second connector,
wherein the one or more voltage sensors includes a first voltage sensor and a second voltage sensor each integrated into the power cable, each of the first voltage sensor and the second voltage sensor having a first voltage sense input and a second voltage sense input; and
wherein the plurality of voltage sense lines includes:
a first voltage sense line connected between (i) the positive voltage line at the first connector and (ii) the first voltage sense input of the first voltage sensor;
a second voltage sense line connected between (i) the second voltage sense input of the first voltage sensor and (ii) the positive voltage line at the second connector;
a third voltage sense line connected between (i) the negative voltage line at the first connector and (ii) the first voltage sense input of the second voltage sensor; and
a fourth voltage sense line connected between (i) the second voltage sense input of the second voltage sensor and (ii) the negative voltage line at the second connector, the method including:
receiving, from the one or more voltage sensors, voltage data indicative of a voltage drop across the power cable between (i) a busbar connected to the power cable and (ii) a load that includes at least the PDB and the one or more processing devices
analyzing the voltage data using the BMC to determine the voltage drop across the power cable;
shutting down the computing device using the BMC in response to the voltage drop across the power cable exceeding: (i) a high voltage drop threshold, and (ii) a low voltage drop threshold that is less than the high voltage drop threshold; and
transmitting an alert using the BMC in response to the voltage drop across the power cable exceeding the low voltage drop threshold but not the high voltage drop threshold.

15. The method of claim 14, wherein the high voltage drop threshold is about 100 millivolts (mV) and the low voltage drop threshold is about 55 mV.

16. The method of claim 14, wherein values of the high voltage drop threshold and the low voltage drop threshold are stored in firmware of the BMC, and wherein the method further comprises, prior to analyzing the voltage data, updating the value of the high voltage drop threshold, the value of the low voltage drop threshold, or both.

\* \* \* \* \*